US012411180B2

(12) United States Patent
Ekler et al.

(10) Patent No.: US 12,411,180 B2
(45) Date of Patent: Sep. 9, 2025

(54) ERROR COMPENSATION BASED ON WIRE RESISTANCE IN BATTERY MONITORING CIRCUITS

(71) Applicant: Infineon Technologies AG, Neubiberg (DE)

(72) Inventors: Markus Ekler, Feldkirchen (DE); Christian Walther, Munich (DE)

(73) Assignee: Infineon Technologies AG, Neubiberg (DE)

( * ) Notice: Subject to any disclaimer, the term of this patent is extended or adjusted under 35 U.S.C. 154(b) by 666 days.

(21) Appl. No.: 17/664,958

(22) Filed: May 25, 2022

(65) Prior Publication Data
US 2023/0384386 A1 Nov. 30, 2023

(51) Int. Cl.
*G01R 31/3842* (2019.01)
*G01R 31/389* (2019.01)

(52) U.S. Cl.
CPC ....... *G01R 31/3842* (2019.01); *G01R 31/389* (2019.01)

(58) Field of Classification Search
CPC .............. G01R 31/3842; G01R 31/389; G01R 31/396; G01R 35/00; G01R 31/385
USPC ........................................................ 320/132
See application file for complete search history.

(56) References Cited

U.S. PATENT DOCUMENTS

| | | | |
|---|---|---|---|
| 7,548,821 B2* | 6/2009 | Tae ...................... | G01R 31/389 702/63 |
| 7,772,851 B2* | 8/2010 | Al-Anbuky ........... | H01M 10/44 324/429 |
| 8,368,247 B2* | 2/2013 | Colombo ................. | H03K 5/08 307/103 |
| 8,754,614 B2* | 6/2014 | Paryani ............... | H01M 10/443 320/160 |
| 8,933,702 B2* | 1/2015 | Deveau ................ | G01R 31/396 324/429 |
| 9,274,178 B2* | 3/2016 | Zhang ................... | G01R 31/389 |
| 9,404,975 B2* | 8/2016 | Kudo ................. | G01R 31/3648 |
| 9,774,206 B2* | 9/2017 | Kim ....................... | H02J 7/0016 |
| 9,851,413 B2* | 12/2017 | Jeon ........................ | G01R 35/00 |
| 10,317,292 B2* | 6/2019 | Liaghati ................... | G01K 7/20 |

(Continued)

FOREIGN PATENT DOCUMENTS

JP   2017133974 A * 8/2017 ........... G01R 19/165

OTHER PUBLICATIONS

"TLE9012DQU: Li-ion battery monitoring and balancing IC", Infineon, Retrieved from: https://www.infineon.com/dgdl/Infineon-TLE9012DQU-DataSheet-v01_00-EN.pdf?fileId=8ac78c8c7e7124d1017f0c3d27c75737, Accessed on: May 24, 2022, 76 pp.

*Primary Examiner* — M Baye Diao
(74) *Attorney, Agent, or Firm* — Shumaker & Sieffert, P.A.

(57) ABSTRACT

A method for monitoring a particular battery cell among a plurality of battery cells may be performed by a battery monitoring circuit, wherein a supply wire from a supply circuit and a voltage measurement wire of a battery management circuit comprises a shared path for the particular battery cell. The method may comprise performing a first voltage measurement associated with the particular battery cell; performing a second voltage measurement associated with the particular battery cell and an additional element; and determining a cell voltage associated with the particular battery cell based on the first voltage measurement and the second voltage measurement.

23 Claims, 9 Drawing Sheets

(56) References Cited

U.S. PATENT DOCUMENTS

| | | | |
|---|---|---|---|
| 10,901,045 B2* | 1/2021 | Weidner | H01M 10/425 |
| 11,054,484 B2* | 7/2021 | Tomonaga | H01M 10/482 |
| 11,056,892 B2* | 7/2021 | Panis | H02J 7/00 |
| 11,802,917 B1* | 10/2023 | Walther | G01R 31/389 |
| 12,080,857 B2* | 9/2024 | Cassagnes | B60L 58/22 |
| 2006/0102476 A1* | 5/2006 | Niwa | G01N 27/4067 |
| | | | 204/421 |
| 2015/0137824 A1* | 5/2015 | Nishihara | B60L 3/12 |
| | | | 320/136 |
| 2016/0061909 A1* | 3/2016 | Iino | G01R 31/3835 |
| | | | 324/432 |
| 2016/0187427 A1* | 6/2016 | Jeon | G01R 31/392 |
| | | | 324/434 |
| 2019/0146039 A1* | 5/2019 | Schmidt | H01M 10/482 |
| | | | 324/430 |
| 2019/0305386 A1* | 10/2019 | Lee | G01R 31/392 |
| 2020/0350641 A1* | 11/2020 | Lee | H01M 50/204 |

\* cited by examiner

ERROR COMPENSATION BASED ON WIRE RESISTANCE IN BATTERY MONITORING CIRCUITS

TECHNICAL FIELD

This disclosure relates to battery management circuits, and more specifically, circuits configured to perform one or more battery cell monitoring functions for a plurality of battery cells.

BACKGROUND

Battery powered devices, such as electric vehicles, often include many battery cells connected in series to form a battery system for the battery powered device. For such battery systems, battery management systems (BMSs) are often used for battery cell monitoring, thermal monitoring, cell balancing of different battery cells or different sets of battery cells, or other battery management functions.

BMSs often use several different battery monitoring circuits in order to monitor all of the battery cells of a battery powered device. For example, each of the battery monitoring circuits may monitor a subset of the battery cells of a battery system that is used to provide power to a battery powered device. Battery monitoring circuits may be capable of monitoring several cells using different analog-to-digital converters or using multiplexing techniques. The number of channels for each battery monitoring circuit, however, may be limited, and therefore, several battery monitoring circuits may be needed within a BMS in order to monitor all of the cells of a battery system.

For example, an electrical vehicle may include a battery system with one hundred or more lithium-ion battery cells connected in series, but battery monitoring circuits may include a more limited number of channels, e.g., only twelve channels. In this case, nine battery monitoring circuits may be needed within a BMS to monitor all one hundred cells of the battery system.

Given the large number of cells that may require cell monitoring in electric vehicles and other battery intensive devices, the number of wires needed in a BMS system can become excessive. Therefore, circuits and techniques that can help reduce the number of wires in such circuits are very desirable.

SUMMARY

In general, this disclosure is directed to techniques and circuits for monitoring battery cells. The circuits and techniques may improve the accuracy of cell voltage measurements, especially in situations where a supply wire associated with a supply interface and a voltage measurement wire comprise a shared path associated with a particular battery cell. Improving the accuracy of cell voltage measurements can help improve battery performance and may be especially desirable in safety-critical applications, such as in battery management systems of electric vehicles.

In some examples, this disclosure describes battery cell monitoring techniques that perform a first voltage measurement associated with the particular battery cell and perform a second voltage measurement associated with the particular battery cell and an additional element. The additional element, for example, may comprise an additional load that is controllable via a switch or an additional current source that is switchable. The techniques of this disclosure may determine a cell voltage associated with the particular battery cell based on the first voltage measurement and the second voltage measurement. Moreover, in some examples, a battery monitoring circuit may be configured to define an offset value based on the first voltage measurement and the second voltage measurement, wherein the battery monitoring circuit is further configured to perform one or more battery management functions based on one or more additional cell voltage measurements and the offset value.

In one example, this disclosure describes a battery monitoring circuit configured to monitor a plurality of battery cells, wherein the battery monitoring circuit is configured to be connected to a supply interface that supplies power to the battery monitoring circuit. The battery monitoring circuit may be configured perform cell voltage measurements for the plurality of battery cells, wherein a supply wire associated with the supply interface and a voltage measurement wire of the battery management circuit comprises a shared path for one or more of the plurality of battery cells. For a particular battery cell associated with the shared path, the battery management circuit is configured to: perform a first voltage measurement associated with the particular battery cell; perform a second voltage measurement associated with the particular battery cell and an additional element; and determine a cell voltage associated with the particular battery cell based on the first voltage measurement and the second voltage measurement.

In another example, this disclosure describes a method for monitoring a particular battery cell among a plurality of battery cells, wherein a supply wire from a supply circuit and a voltage measurement wire of a battery management circuit comprises a shared path for the particular battery cell. The method may comprise performing a first voltage measurement associated with the particular battery cell, performing a second voltage measurement associated with the particular battery cell and an additional element, and determining a cell voltage associated with the particular battery cell based on the first voltage measurement and the second voltage measurement.

In another example, this disclosure describes a battery management system (BMS) configured to monitor a plurality of battery cells arranged in series. The BMS may comprise a first battery management circuit configured to monitor a first subset of the plurality of battery cells, and a second battery management circuit configured to monitor a second subset of the plurality of battery cells, wherein the second subset is different than the first subset. The first battery management circuit and the second battery management circuit may each comprise a battery monitoring circuit, and a supply interface circuit configured to supply power to the battery monitoring circuit. The battery monitoring circuit is configured perform cell voltage measurements for a respective subset of the plurality of battery cells and wherein a supply wire from the supply interface circuit and a voltage measurement wire of the battery monitoring circuit comprises a shared path for one or more of the respective subset of the plurality of battery cells, wherein for a particular battery cell associated with the shared path, the respective battery monitoring circuit is configured to: perform a first voltage measurement associated with the particular battery cell, perform a second voltage measurement associated with the particular battery cell and an additional element, and determine a cell voltage associated with the particular battery cell based on the first voltage measurement and the second voltage measurement.

Details of these and other examples are set forth in the accompanying drawings and the description below. Other features, objects, and advantages will be apparent from the description and drawings, and from the claims.

DETAILED DESCRIPTION

This disclosure is directed to techniques and circuits for monitoring battery cells. The circuits and techniques may improve the accuracy of cell voltage measurements, especially in situations where a supply wire associated with a supply interface and a voltage measurement wire comprise a shared path associated with a particular battery cell. In this situation, since the supply wire and the voltage measurement wire comprise a shared path, the techniques of this disclosure may take additional steps to achieve more accurate cell voltage measurements than conventional cell voltage measurement techniques.

In some examples, the techniques of this disclosure may introduce a switchable load or a switchable current source on the shared path. The switchable load or switchable current source may be used to introduce a pre-defined or known amount of current source or current sink on the shared path. Two different cell voltage measurements can be made, i.e., one measurement with the additional load or additional current source and one measurement without the additional load or additional current source. A difference between the two different voltage measurements can be used to determine a resistance along the shared path, which may include an otherwise unknown parasitic resistance (or other parasitics) due to the shared path. Given the resistance along the shared path, the accuracy of cell voltage measurements can be improved. The shared path may be desirable to help reduce the number of wires in a battery management system.

In some cases, the techniques of this disclosure can be used to define an offset value associated with the shared path, in which case, the offset value may be used in combination with direct cell voltage measurements of the battery cell. An offset value may be useful with direct cell voltage measurements to improve the accuracy of the measurement. The differential cell voltage measurement techniques of this disclosure can be performed once (or periodically) to define the offset value, which can be used to compensate for parasitics on the shared path during on more subsequent cell voltage measurements. In still other examples, the differential cell voltage measurement techniques of this disclosure can be used any time a voltage measurement is performed on a battery cell. The techniques may also be useful in other situations, such as for accurately measuring voltages of any battery cells and compensating for wire resistance (e.g., possibly even for one or more cells that do not have a shared path with a supply interface).

Figure 1:
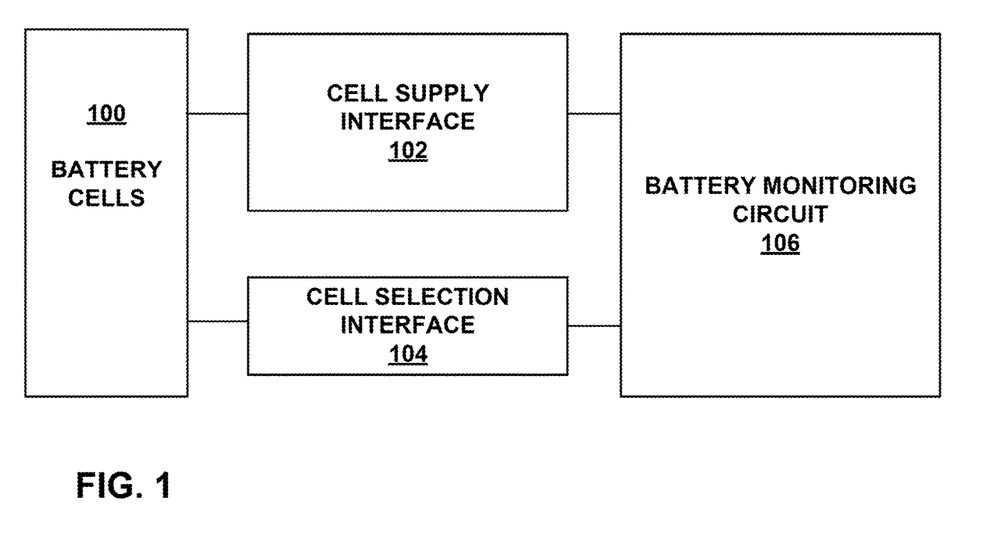
FIG. 1 is a block diagram showing battery cells and a battery monitoring system (BMS) that includes a battery monitoring circuit.

FIG. 1 is a block diagram showing battery cells and a battery management system (BMS) that includes a supply interface circuit 102 and a battery monitoring circuit 106 used to monitor battery cells 100. Battery cells 100 may comprise a set of battery cells connected in series. In order to monitor battery cells, supply interface circuit 102 uses power from battery cells 100 to supply power to cell selection interface circuit 104 and battery monitoring circuit 106. Cell selection interface circuit 104 individually connects each cell within battery cells 100 to battery monitoring circuit 106 so that battery monitoring circuit 106 can monitor each cell, such as by measuring or tracking the potential energy stored in each cell. For example, cell selection unit 104 may comprise circuit elements that form a multiplexer, one or more switch(es) and wires, or another type of selection interface that can individually connect each cell within battery cells 100 to battery monitoring circuit 106.

According to this disclosure, one or more of battery cells 100 may define a shared path for voltage measurements performed by battery monitoring circuit 106 and cell supply interface 102. The shared path may be desirable to help reduce the number of wires in the BMS. According to this disclosure, battery monitoring circuit 106 may be configured to introduce a switchable load or a switchable current source on the shared path. The switchable load or switchable current source may be used to introduce a pre-defined or known amount of current source or current sink on the shared path. Two different cell voltage measurements can be made by battery monitoring circuit 106 for the battery cell that uses the shared path, i.e., one measurement with the additional load or additional current source and one measurement without the additional load or additional current source. A difference between the two different voltage measurements can be used to determine a resistance along the shared path, which may include an otherwise unknown parasitic resistance (or other parasitics) due to the shared path. Given the resistance along the shared path, the accuracy of cell voltage measurements can be improved. Thus, the first and second measurements can be used to determine a more accurate cell voltage than can be achieved with conventional techniques insofar as the two measurements can be used to determine and compensate for parasitics in the shared path.

In some cases, battery monitoring circuit 106 may define an offset value associated with the shared path, in which case, the offset value may be used in combination with direct cell voltage measurements of the individual battery cell that uses the shared path. An offset value may be useful with direct cell voltage measurements to improve the accuracy of the measurement. In this case, the offset value may generally correspond to a voltage drop associated with the parasitic resistance on the shared path. Accordingly, in some examples, the differential cell voltage measurement techniques of this disclosure can be performed by battery management circuit 106 once (or periodically) to define the offset value, which can then be used by battery monitoring circuit 106 to compensate for parasitics on the shared path during on more subsequent cell voltage measurements by battery monitoring circuit 106.

Figure 2:
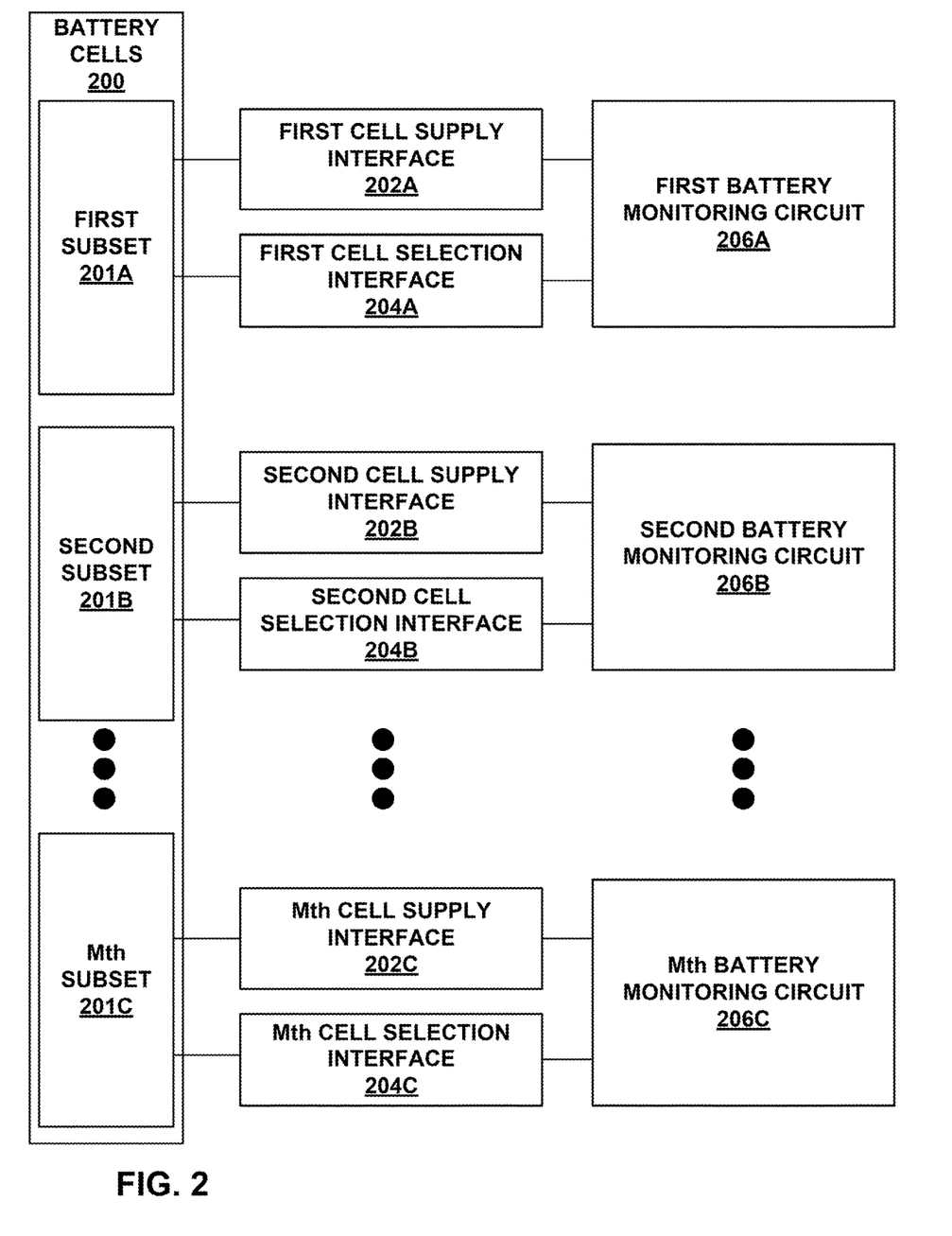
FIG. 2 is a block diagram showing battery cells and a BMS that includes several battery monitoring circuits.

FIG. 2 is a block diagram showing battery cells and a BMS that includes several battery monitoring circuits 206A, 206B, 206C for monitoring different subsets 201A, 201B, 201C of a larger set of battery cells 200. In particular, battery cells 200 may include a first subset 201A of battery cells, a second subset 201B of battery cells, and an Mth subset 201C of battery cells. In FIG. 2, "M" may represent any positive integer greater than 2. More generally, cells 200 may include any number of cells that may be divided into any number of different subsets, e.g., two or more subsets. The different subsets may have the same or different numbers of battery cells. For each of the subsets 201A, 201B, 201C of battery cells, a cell selection interface circuit 204A, 204B, 204C may individually connect each cell within a respective subset to a respective battery monitoring circuit 206A, 206B, 206C. Supply interface circuits 202A, 202B, 202C may uses power from battery cells 200 to supply power to cell selection interface circuits 204A, 204B, 204C, and to battery monitoring circuits 206A, 206B, 206C. Battery monitoring circuits 206A, 206B, 206C may be configured to monitor each individual cell within battery cells 200, such as by periodically measuring or tracking the potential energy stored in each cell.

According to this disclosure, each of battery monitoring circuits 206A, 206B, 206C may be configured to introduce a switchable load or a switchable current source on a shared path associated with a battery cell. The shared path, for example, may comprise a top-most wire of a cell supply interface 202A, 202B, or 202C, or a bottom-most wire of cell supply interface 202A, 202B, or 202C, e.g., coupled to a ground potential. The switchable load or switchable current source may be used to introduce a pre-defined or known amount of current source or current sink on the shared path. Two different cell voltage measurements can be made by battery monitoring circuits 206A, 206B, 206C for any battery cell that uses a shared path with a cell supply interface circuit 202A, 202B, 202C, i.e., one measurement with the additional load or additional current and one measurement without the additional load or additional current. A difference between the two different voltage measurements can be used to determine a resistance along the shared path, which may include an otherwise unknown parasitic resistance (or other parasitics) due to the shared path. Given the resistance along the shared path, the accuracy of cell voltage measurements can be improved. Thus, the first and second measurements can be used to determine a more accurate cell voltage than can be achieved with conventional techniques insofar as the two measurements can be used to determine and compensate for parasitics in the shared path.

Consistent with this disclosure, a BMS such as that shown in FIG. 2 may be configured to monitor a plurality of battery cells 200 arranged in series, the BMS comprising: a first battery management circuit configured to monitor a first subset of the plurality of battery cells 201A; and a second battery management circuit configured to monitor a second subset of the plurality of battery cells 201B, wherein the second subset 201B is different than the first subset 201A, wherein the first battery management circuit and the second battery management circuit each comprise: a battery monitoring circuit 206A, 206B; and a supply interface circuit 202A, 202B configured to supply power to the battery monitoring circuit 206A, 206B. Each battery monitoring circuit 206A, 206B is configured perform cell voltage measurements for a respective subset of the plurality of battery cells and wherein a supply wire from the supply interface circuit 202A, 202B and a voltage measurement wire of the battery management circuit 206A, 206B comprises a shared path for one or more of the respective subsets of the plurality of battery cells, wherein for a particular battery cell associated with the shared path, the respective battery monitoring circuit is configured to: perform a first voltage measurement associated with the particular battery cell; perform a second voltage measurement associated with the particular battery cell and an additional element; and determine a cell voltage associated with the particular battery cell based on the first voltage measurement and the second voltage measurement. In some examples, the BMS shown in FIG. 2 includes M battery monitoring circuits 206A, 206B, 206C configured to monitor M subsets of the plurality of battery cells 200, wherein M is a positive integer greater than 2.

Figure 3:
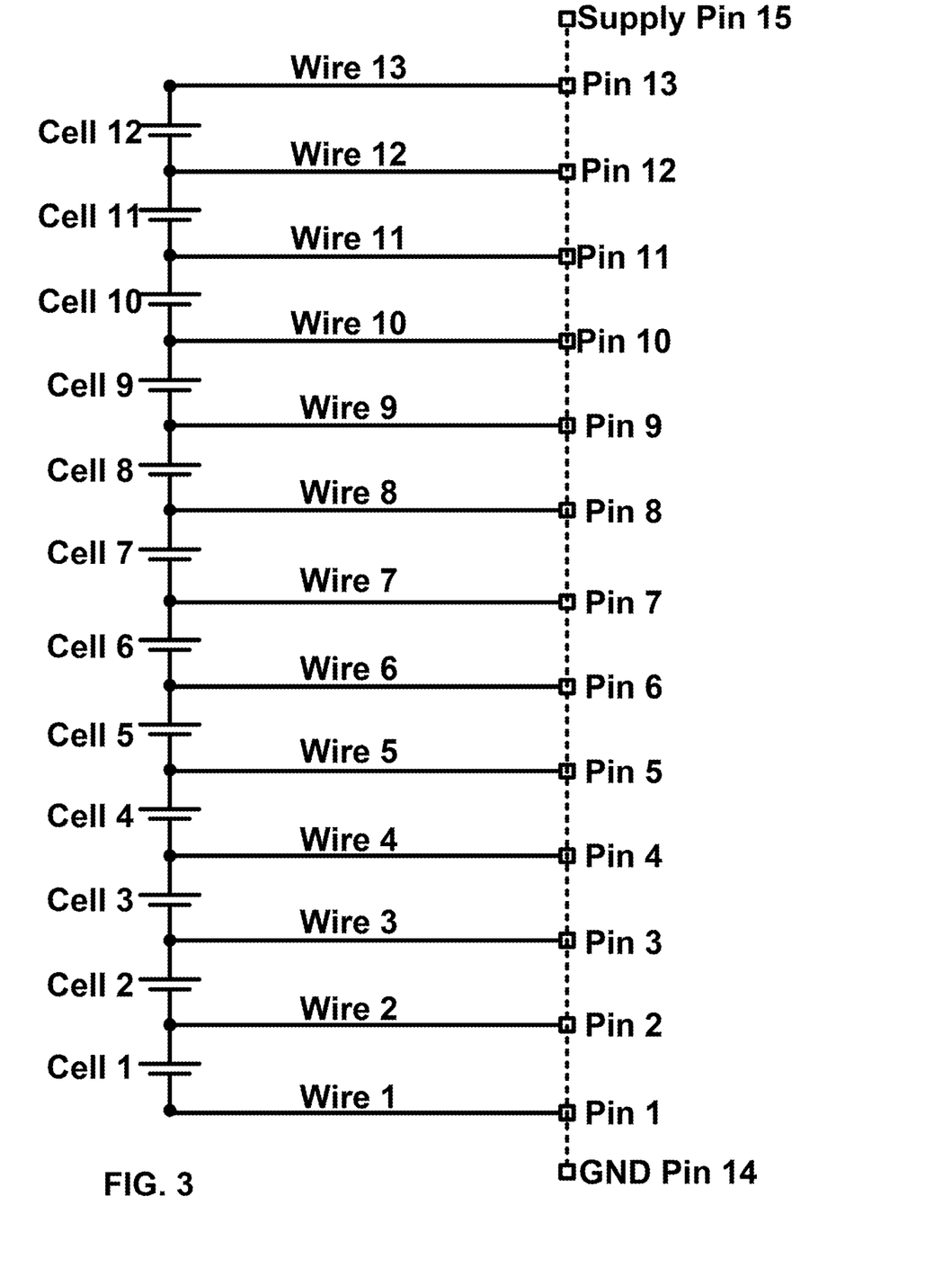
FIG. 3 is a circuit diagram showing twelve battery cells connected in series, with 13 wire connections to 15 pins, where two of the wire connections comprise shared paths associated with a power supply.

FIG. 3 is a circuit diagram showing twelve battery cells connected in series, with 13 wire connections to 15 pins, where at least two of the wire connections comprise shared paths associated with a power supply. Wire 13 and wire 1 may define shared paths with the supply. Supply pin 15 and pin 13 both use wire 13. Moreover, ground pin 14 and pin 1 both use wire 1.

A battery monitoring device is usually supplied by power from the cells being monitored. One main function of a battery monitoring device is to accurately measure voltage. To do so, wires 1-13 are used to connect to each side of cells 1-12 in order to monitor the voltage on each of cells 1-12. Moreover, a configuration like that shown in FIG. 3 is desirable to reduce the number of wires from 15 to 13 by eliminating a separate wire for supply pin 15 and ground pin 14. Instead, supply pin 15 shares wire 13 with pin 13, and ground pin 14 shares wire 1 with pin 1. Thus, wire 13 defines a shared path for cell 12, and wire 1 defines a shared path for cell 1. Unfortunately, the shared path can introduce parasitic resistance (or other parasitics) that are more substantial than those of other wires that do not define shared paths with the supply. Moreover, the supply and ground pins often include fuses or connectors that can add to the parasitic effects.

The techniques of this disclosure may introduce an additional current load (e.g., and artificial increase in the current consumption) on a supply line to help accurately determine wire resistance and thereby improve cell voltage determinations. In some cases, the calculated resistance can be used to calculate a correction factor for the affected cell voltage measurements. To do so, a cell monitoring device may perform two separate measurements: one measurement with the nominal current consumption and one with a known, leveraged current defined by a switchable current source or switchable load. The voltage difference between those measurements allows the calculation of the wire network resistance, which can improve cell voltage determinations.

Figure 4:
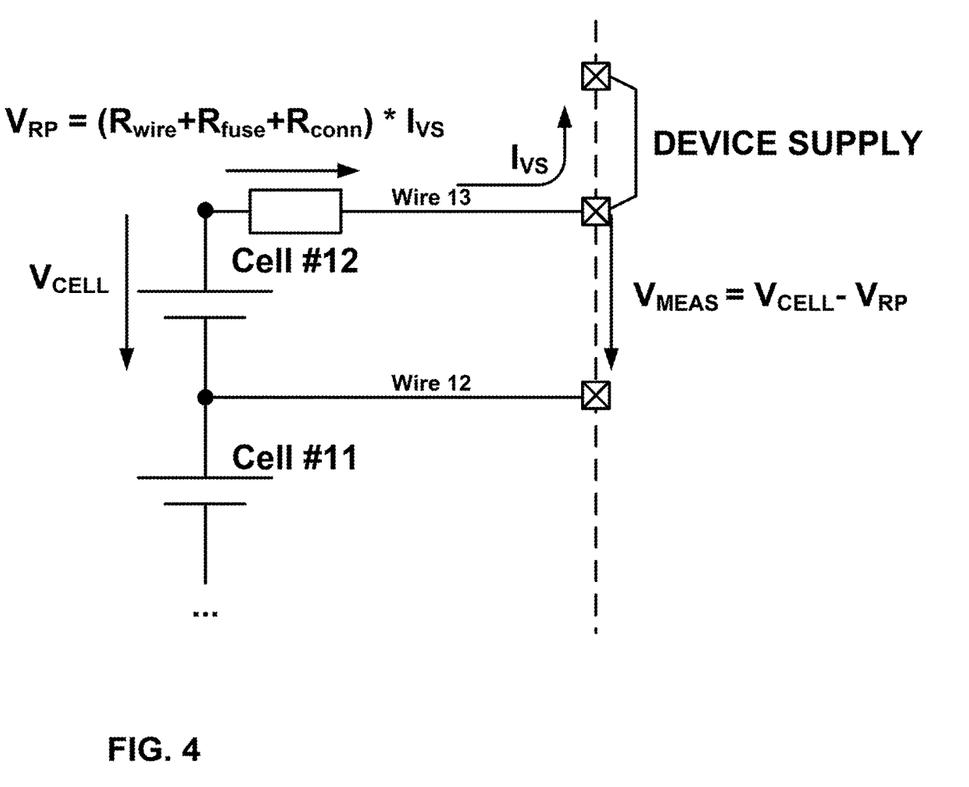
FIG. 4 is a circuit diagram showing a shared path associated with a power supply and cell voltage monitoring for a twelfth cell among a plurality of cells.

FIG. 4 is a circuit diagram showing a shared path associated with a power supply and cell voltage monitoring for a twelfth cell among a plurality of cells. FIG. 4 may help to illustrate a problem that can be addressed by the techniques of this disclosure. As shown in FIG. 4, wire 13 defines a shared path for cell voltage measurement of the voltage ($V_{CELL}$) of Cell #12. The voltage on Cell #12 can be measured ($V_{MEAS}$), but this measurement does not account for the voltage drop on the resistive path ($V_{RP}$), which is unknown and may be affected by wire resistance $R_{WIRE}$, and resistance of other elements associated with the shared path or the supply, including for example a fuse resistance $R_{fuse}$ and a connector resistance $R_{conn}$. In this case, $V_{RP}$ is equal to $(R_{WIRE}+R_{fuse}+R_{conn})*I_{VS}$, where $I_{VS}$ is a supply current. $V_{MEAS}=V_{CELL}-V_{RP}$, but $V_{RP}$ is unknown since $(R_{WIRE}+R_{fuse} R_{conn})$ is unknown.

Figure 5:
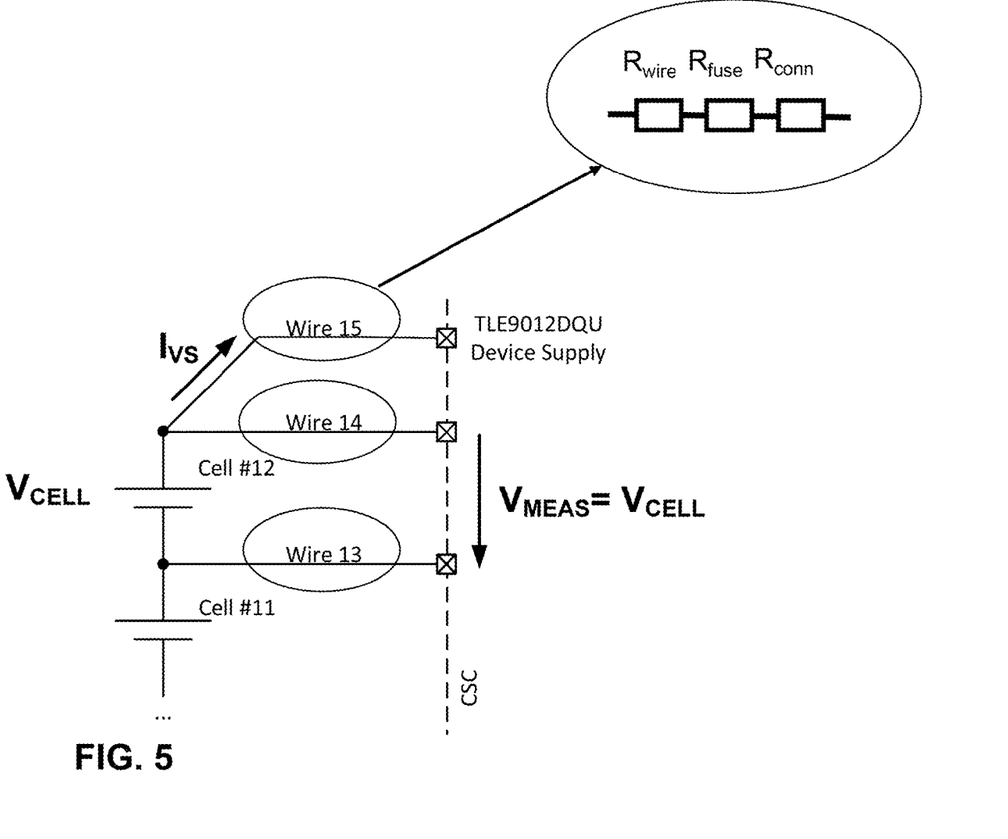
FIG. 5 is a circuit diagram showing an arrangement that does not include a shared path for a twelfth cell among a plurality of cells.

FIG. 5 is a circuit diagram showing an arrangement that does not include a shared path for a twelfth cell among a plurality of cells. FIG. 5 shows one possible solution to the problem shown in FIG. 4, but the solution shown in FIG. 5 introduces additional wires, which are undesirable. With two additional wires (e.g., wire 15 and a similar additional wire associated with cell 1 (not shown in FIG. 5) and ground (not shown in FIG. 5), the additional parasitic wire resistance $(R_{WIRE}+R_{fuse}+R_{conn})$ can be reduced or eliminated from wire 14 such that $V_{MEAS}=V_{CELL}$. Instead, the additional parasitic wire resistance $(R_{WIRE}+R_{fuse}+R_{conn})$ is present on the additional wire 15. Again, the use of additional wires (e.g., wire 15) to address the problem are generally undesirable.

Figure 6:
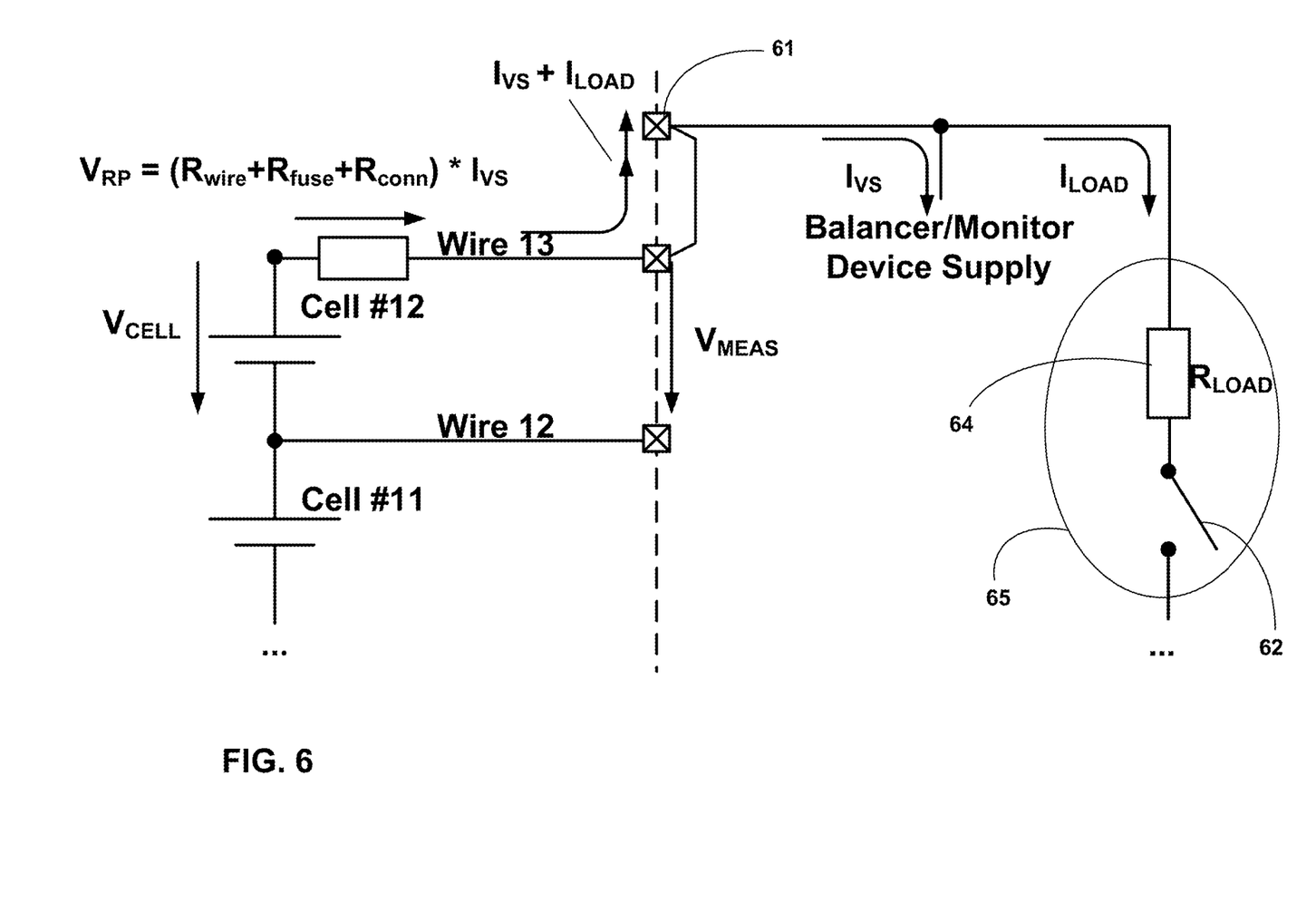
FIG. 6 is a circuit diagram showing a shared path associated with a power supply and cell voltage monitoring for a twelfth cell among a plurality of cells, which includes a switchable load in the shared path.

FIG. 6 is a circuit diagram showing a shared path associated with a power supply and cell voltage monitoring for a twelfth cell among a plurality of cells, which includes a switchable load 65 in the shared path. A battery monitoring circuit consistent with the example shown in FIG. 6 may be configured to monitor a plurality of battery cells, and the battery monitoring circuit may be configured to be connected to a supply interface that supplies power to the battery monitoring circuit. Supply pin 61, for example, may define the supply interface.

As described herein, for at least one of the plurality of battery cells, a supply wire associated with the supply interface and a voltage measurement wire of the battery management circuit comprises a shared path. This shared path, for example, may comprise wire 13 shown in FIG. 6 with respect to the monitoring of cell number 12 shown in FIG. 6. For cell number 12 or for any other cell that defines a shared path for voltage monitoring and supply, the battery management circuit may be configured to: perform a first voltage measurement associated with the particular battery cell, e.g., cell number 12, and perform a second voltage measurement associated with the particular battery cell and an additional element. In the example of FIG. 6, the additional element comprises an additional load 64, wherein a battery monitoring circuit may be configured to perform the second voltage measurement by controlling a switch 62 to introduce the additional load 64 on the shared path. Thus, additional load 64 and switch 62 collectively define a switchable load 65 that can be introduced on the shared path for the second voltage measurement.

Although FIG. 6 shows the shared path on wire 13, there may also be another shared path on wire 1, which may include a shared path to ground (such as shown in FIG. 3). Thus, in some examples, a battery monitoring circuit includes at least two different shared paths associated with at least two different battery cells (e.g., a top-most cell and a bottom-most cell of a set of cells arranged in series). Cells 1 and 12 of FIG. 3 are examples of two cells that may each include a shared path to a supply node (e.g., to a voltage supply or to a voltage reference such as ground). Thus, consistent with FIGS. 6 and 3, in some examples, a battery monitoring circuit includes 13 wires and is configured to monitor 12 battery cells, wherein the battery monitoring circuit includes two shared paths associated with the supply interface circuit and two particular battery cells, wherein for each of the particular battery cells, the battery monitoring circuit is configured to: perform the first voltage measurement associated with the particular battery cell; perform the second voltage measurement associated with the particular battery cell and the additional element; and determine the cell voltage associated with the particular battery cell based on the first voltage measurement and the second voltage measurement. Even more generally, consistent with FIGS. 6 and 3, in some examples, a battery monitoring circuit includes n wires and is configured to monitor n−1 battery cells, where n is a positive integer greater than 2. The same concepts described herein could apply to 16 channel devices, 18 channel devices or devices with any number of channels. With 18 channels for example, the battery monitoring circuit may include 17 wires configured to monitor 18 battery cells.

To determine the cell voltage, in some examples, a battery monitoring circuit is configured to calculate a resistance associated with the shared path based on the first voltage measurement and the second voltage measurement, calculate a voltage drop associated with the shared path, and determine the cell voltage based on a measured voltage drop associated with the particular battery cell minus the voltage drop associated with the shared path. The first voltage measurement may be defined as defined as:

$$V\text{MEAS1}=V\text{Cell}+(R\text{wire}+R\text{fuse}+R\text{conn})*I\text{vs, and}$$

The second voltage measurement may be defined as:

$$V\text{MEAS2}=V\text{Cell}+(R\text{wire}+R\text{fuse}+R\text{conn})*(I\text{vs}+I\text{load}).$$

In this example, VMEAS1 is the first voltage measurement, VMEAS2 is the second voltage measurement, VCell is the measured voltage drop, (Rwire+Rfuse+Rconn) defines a resistance associated with the shared path, Ivs is current through the particular battery cell, and Iload is current through the additional load. (Rwire+Rfuse+Rconn)= (VMEAS1−VMEAS2)/Iload. Rwire may refer to resistance of a wire in the shared path, Rfuse may refer to a resistance of a fuse associated with the shared path, and Rconn may refer to resistance of a connector element associated with the shared path.

(Rwire+Rfuse+Rconn) may define the parasitic resistance associated with the shared path. In some examples, (Rwire+Rfuse+Rconn) may define an offset value, which is based on the first voltage measurement and the second voltage measurement. A battery monitoring circuit may be configured to determine the cell voltage associated with the particular battery cell based at least in part on the offset value. Moreover, the battery monitoring circuit may be further configured to perform one or more battery management functions based on one or more additional cell voltage measurements and the offset value. In this case, the offset value may define a calculated parasitic resistance associated with the shared path, and this offset value can be used to properly adjust basic voltage measurements of cell number 12 so as to account for voltage drops that occur over the parasitic resistance associated with the shared path.

Offset calculation may be based on the idea to measure the voltage drop over the combined resistance (Rwire+Rfuse+Rconn) and calculate a correction factor for cell voltage measurements associated with that shared path. A compensation factor (i.e., an offset) can be calculated by artificially increasing current consumption during the measurement or by artificially injecting current during the measurement. The offset may refer directly to (Rwire+Rfuse+Rconn), or to a compensation factor that is defined in terms of voltage and is based on the voltage drop over (Rwire+Rfuse+Rconn) at a defined level of current.

In some cases, not all of the cells include a shared path, and therefore, not all of the cells may use the differential measurement techniques of this disclosure. In other words, for cells that do not include a shared path (e.g., cell 11 shown in FIG. 6), the battery monitoring circuit may be configured to determine cell voltages based on measured voltage drops minus voltage drops over unshared pre-defined resistance paths. A cell selector interface (e.g., interface 102 of FIG. 1) may be configured to select each of the plurality of battery cells at different times for the cell voltage measurements for the plurality of battery cells. For cells that include a shared path, the differential measurement techniques of this disclosure may be used, and for cells that do not include a shared path, the battery monitoring circuit may be configured to make direct cell voltage measurements without being concerned with parasitic resistance effects.

In any case, the battery monitoring circuit may be configured to perform one or more battery management functions based on the determined cell voltage for each of the cells within the battery system. The techniques of this disclosure may improve such battery management functions by defining more precise voltage measurements, especially for cells that include a shared path with the supply or ground. For cells that includes a shared path with supply or ground, cell voltage measurements without the techniques of this disclosure may have precision within 30 millivolts, whereas cell voltage measurements using the techniques of this disclosure may have precision within 1 millivolt.

In some examples, the measurement of (Rwire+Rfuse+Rconn) can be viewed as a calibration step, which may be autonomously by the circuit, e.g. if a microcontroller, integrator, or processor sets a bit to instruct the circuit to perform calibration. In some examples, once an offset is defined by (Rwire+Rfuse+Rconn), this offset may be used with direct voltage measurements on the associated battery cell without needing to re-calculate (Rwire+Rfuse+Rconn) every time a voltage measurement is taken. In some examples, the circuit can provide the resistance value for the shared path but may also auto correct the measured values for communication to a microcontroller, and this can also help avoid computing efforts by the microcontroller.

Figure 7:
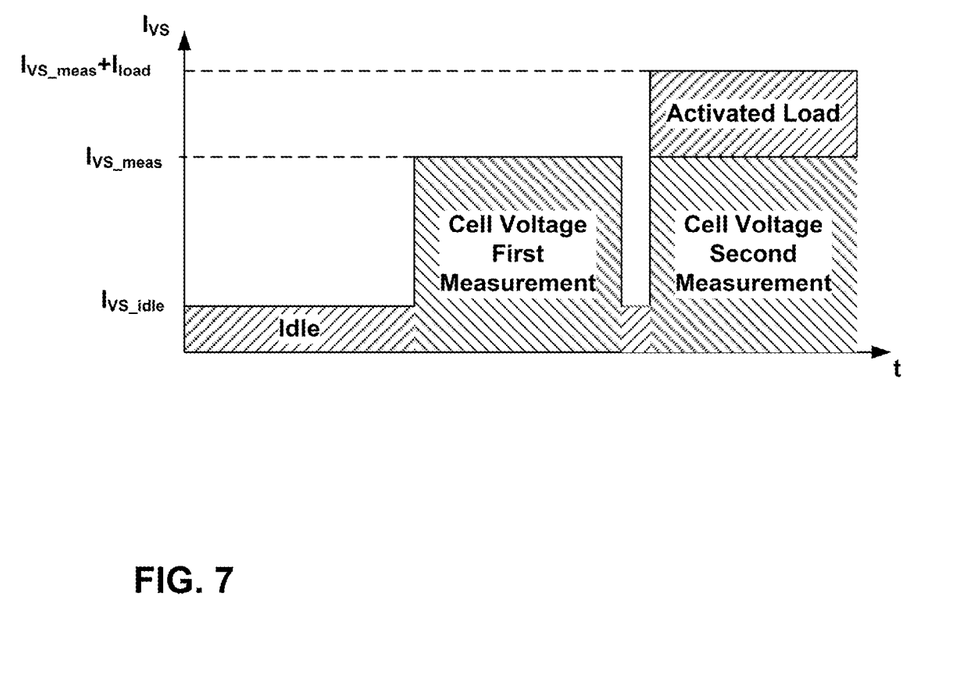
FIG. 7 is graph illustrating cell voltage measurements in the presence of a switchable load.

FIG. 7 is graph illustrating cell voltage measurements in the presence of a switchable load. As can be seen in FIG. 7, the activated load sinks additional current on top of current that is dropped over the cell in the second cell voltage measurement. The current is additive due to the switchable load $I_{LOAD}$ being positioned in parallel with the measurement path of $I_{VS}$, such as shown in FIG. 6.

Figure 8:
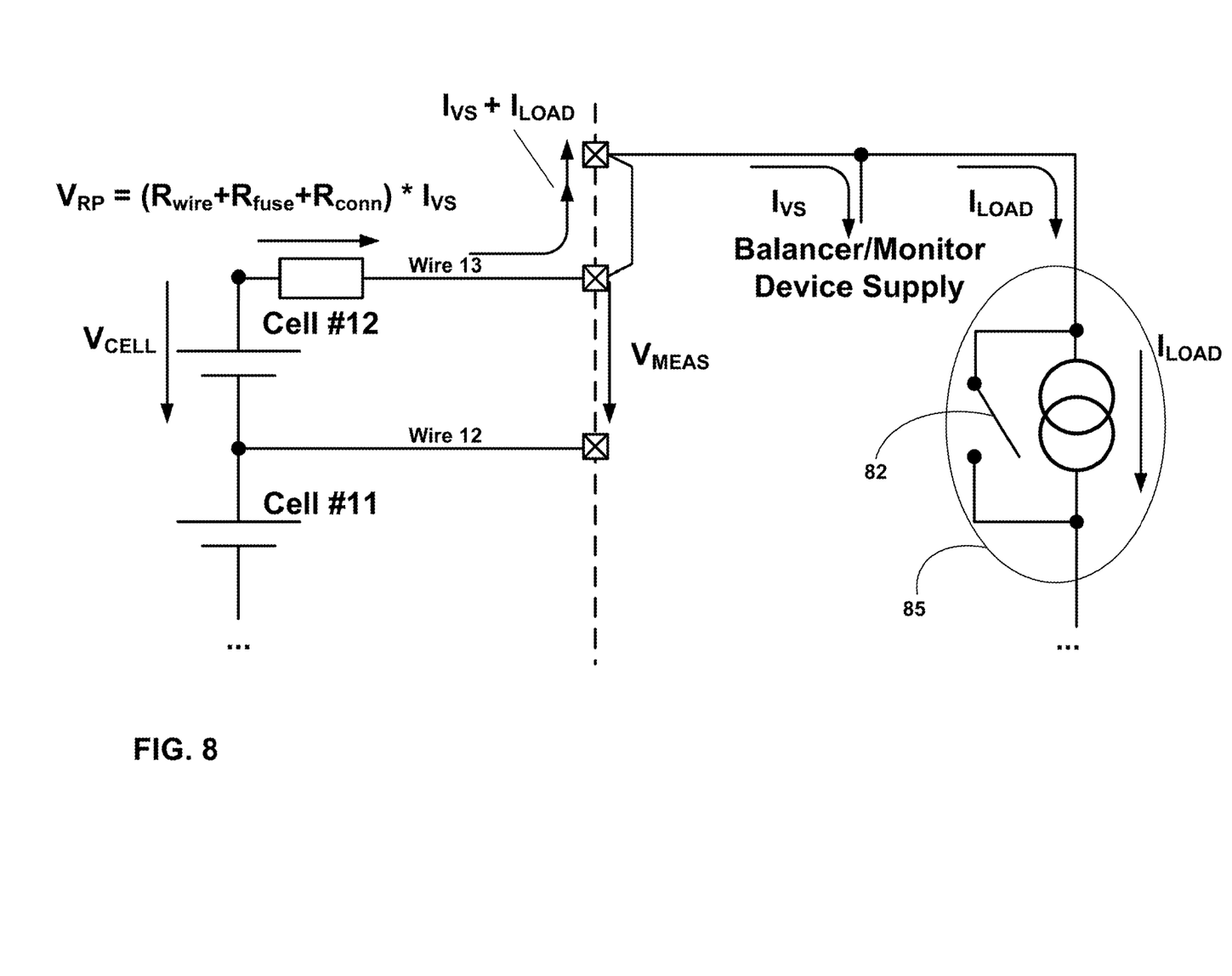
FIG. 8 is a circuit diagram showing a shared path associated with a power supply and cell voltage monitoring for a twelfth cell among a plurality of cells, which includes a switchable current source in the shared path.

FIG. 8 is a circuit diagram showing a shared path associated with a power supply and cell voltage monitoring for a twelfth cell among a plurality of cells, which includes a switchable current source in the shared path. FIG. 8 is similar to FIG. 6 in many respects, and the circuit of FIG. 8 operates similarly to that of FIG. 6 for measuring cell voltage of cell number 12 that includes a shared path along wire 13. However, whereas the circuit of FIG. 6 includes a switchable load 65 in the shared path, the circuit of FIG. 8 includes a switchable current source 85. In this case, a battery monitoring circuit may be configured to control switch 82 to increase or decrease current consumption in the shared path. Thus, like the example of FIG. 6, in the example of FIG. 8, a battery management circuit may be configured to: perform a first voltage measurement associated with the particular battery cell, e.g., cell number 12, and perform a second voltage measurement associated with the particular battery cell and an additional element.

In the example of FIG. 6, the additional element comprises an additional load 64, wherein performing the second voltage measurement includes controlling a switch 62 introduce the additional load 64 on the shared path. In contrast, in the example of FIG. 8, the additional element comprises a switchable current source 85, wherein the battery monitoring circuit is configured to increase or decrease current consumption in the shared path via the switchable current source 85 for the second voltage measurement.

Figure 9:
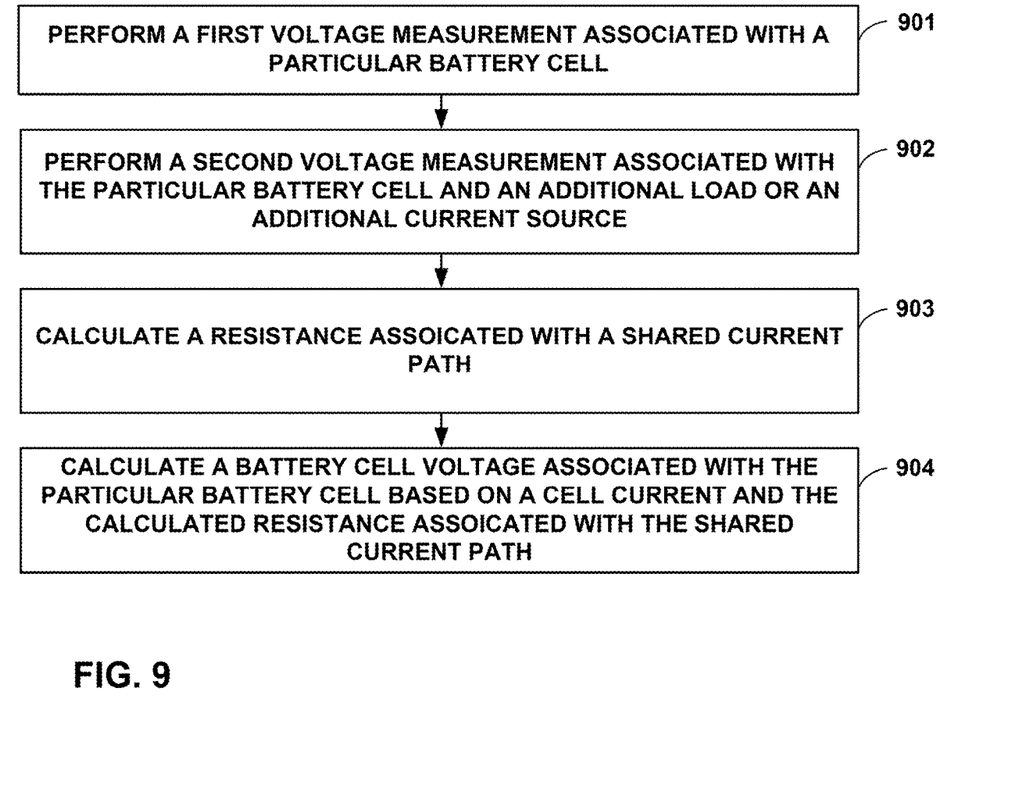
FIG. 9 is a flow diagram consistent with techniques of this disclosure.

FIG. 9 is a flow diagram consistent with techniques of this disclosure. FIG. 9 generally shows a method for monitoring a particular battery cell among a plurality of battery cells, wherein a supply wire from a supply circuit and a voltage measurement wire of a battery management circuit comprises a shared path for the particular battery cell. As shown in FIG. 9, a battery monitoring circuit may perform a first voltage measurement associated with the particular battery cell (901) and perform a second voltage measurement associated with the particular battery cell and an additional element, e.g., an additional load or an additional current source (902). A battery monitoring circuit may then determine a cell voltage associated with the particular battery cell based on the first voltage measurement and the second voltage measurement. For example, as shown in FIG. 9, the battery monitoring circuit may calculate a resistance associated with a shared current path (903), e.g., an offset value, and calculate a battery cell voltage associated with the particular battery cell based on a cell current and the calculated resistance associated with the shared path (904).

Again, in some examples, the additional element in the shared path comprises an additional load, wherein performing the second voltage measurement includes controlling a switch introduce the additional load on the shared path. In other examples, the additional element comprises a switchable current source, in which case, the method may further comprise increasing or decreasing current consumption in the shared path via the switchable current source for the second voltage measurement.

Determining the cell voltage of the particular cell on the shared path may include calculating a resistance associated with the shared path based on the first voltage measurement and the second voltage measurement; calculating a voltage drop associated with the shared path; and determining the cell voltage based on a measured voltage drop associated with the particular battery cell minus the voltage drop associated with the shared path. Again, as set forth above, the first voltage measurement is defined as:

$$VMEAS1 = VCell + (Rwire + Rfuse + Rconn)*Ivs,$$ and the second voltage measurement is defined as:

$$VMEAS2 = VCell + (Rwire + Rfuse + Rconn)*(Ivs + Iload).$$

In this case, VMEAS1 is the first voltage measurement, VMEAS2 is the second voltage measurement, VCell measured voltage drop, Rwire+Rfuse+Rconn is a resistance associated with the shared path, Ivs is current through the particular cell, Iload is current through the additional load, and (Rwire+Rfuse+Rconn)=(VMEAS1−VMEAS2)/Iload.

Methods consistent with FIG. 9 may further comprise selecting each of the plurality of battery cells at different times for different cell voltage measurements for the plurality of battery cells. Methods consistent with FIG. 9 may also comprise performing one or more battery management functions based on the determined cell voltage.

As explained above, in some cases, the method may include defining an offset value based on the first voltage measurement and the second voltage measurement; and determining the cell voltage associated with the particular battery cell based at least in part on the offset value. In this case, the method may also include performing one or more battery management functions based on one or more additional cell voltage measurements and the offset value. The offset value may refer to the parasitic resistance (Rwire+Rfuse+Rconn) or to a voltage drop over (Rwire+Rfuse+Rconn) at some defined level of current.

In summary, according to this disclosure, a circuit may determine the parasitic resistance in a shared current path by introducing a switchable and known current in the shared current path. Artificially increased supply current e.g. by switchable load/switchable current source may result in voltage measurements V1 and V2:

$$V1 = Vcell + Ivs*Rp$$

$$V2 = Vcell + Ivs*Rp + Iload*Rp$$

$$V2 - V1 = Iload*Rp$$

In this case, V2−V1 does not depend on absolute measurement accuracy but on the repeatability of measurements. In some examples, a resulting $Rp=(R_{wire}+R_{fuse}+R_{conn})$ may depend directly on load current value, which means a deviation in load current will linearly influence the value of Rp.

The following clauses may illustrate one or more aspects of the disclosure.

Clause 1—A battery monitoring circuit configured to monitor a plurality of battery cells, wherein the battery monitoring circuit is configured to be connected to a supply interface that supplies power to the battery monitoring circuit, wherein the battery monitoring circuit is configured perform cell voltage measurements for the plurality of battery cells and wherein a supply wire associated with the supply interface and a voltage measurement wire of the battery management circuit comprises a shared path for one or more of the plurality of battery cells, wherein for a particular battery cell associated with the shared path, the battery management circuit is configured to: perform a first voltage measurement associated with the particular battery cell; perform a second voltage measurement associated with the particular battery cell and an additional element; and determine a cell voltage associated with the particular battery cell based on the first voltage measurement and the second voltage measurement.

Clause 2—The battery monitoring circuit of clause 1, wherein the additional element comprises an additional load, wherein to perform the second voltage measurement, the battery monitoring circuit is configured to control a switch introduce the additional load on the shared path Clause 3—The battery monitoring circuit of clause 1, wherein the additional element comprises a switchable current source, wherein the battery monitoring circuit is configured to increase or decrease current consumption in the shared path via the switchable current source for the second voltage measurement.

Clause 4—The battery monitoring circuit of any of clauses 1-3, wherein the battery monitoring circuit includes at least two different shared paths associated with at least two different battery cells.

Clause 5—The battery monitoring circuit of any of clauses 1-4, wherein the battery monitoring circuit includes n wires and is configured to monitor n−1 battery cells where n is a positive integer greater than 2, wherein the battery monitoring circuit includes two shared paths associated with the supply interface circuit and two particular battery cells, wherein for each of the particular battery cells, the battery monitoring circuit is configured to: perform the first voltage measurement associated with the particular battery cell; perform the second voltage measurement associated with the particular battery cell and the additional element; and determine the cell voltage associated with the particular battery cell based on the first voltage measurement and the second voltage measurement.

Clause 6—The battery monitoring circuit of any of clauses 1-5, wherein to determine the cell voltage, the battery monitoring circuit is configured to calculate a resistance associated with the shared path based on the first voltage measurement and the second voltage measurement, calculate a voltage drop associated with the shared path, and determine the cell voltage based on a measured voltage drop associated with the particular battery cell minus the voltage drop associated with the shared path.

Clause 7—The battery monitoring circuit of clause 6, wherein:

the first voltage measurement is defined as:

$$VMEAS1 = VCell + (Rwire + Rfuse + Rconn)*Ivs,\text{ and}$$

the second voltage measurement is defined as:

$$VMEAS2 = VCell + (Rwire + Rfuse + Rconn)*(Ivs + Iload),\text{ and}$$

wherein VMEAS1 is the first voltage measurement, VMEAS2 is the second voltage measurement, VCell is the measured voltage drop, (Rwire+Rfuse+Rconn) defines a resistance associated with the shared path, Ivs is current through the particular battery cell, and Iload is current through the additional load, and wherein: (Rwire+Rfuse+Rconn)=(VMEAS1−VMEAS2)/Iload.

Clause 8—The battery monitoring circuit of any of clauses 1-7, wherein for at least some of the plurality of battery cells that do not include the shared path, the battery monitoring circuit is configured to determine cell voltages based on measured voltage drops minus voltage drops over unshared pre-defined resistance paths.

Clause 9—The battery monitoring circuit of any of clauses 1-8, further comprising: a cell selection interface configured to select each of the plurality of battery cells at different times for the cell voltage measurements for the plurality of battery cells.

Clause 10—The battery monitoring circuit of any of clauses 1-9, wherein the battery monitoring circuit is configured to perform one or more battery management functions based on the determined cell voltage.

Clause 11—The battery monitoring circuit of any of clauses 1-10, wherein the battery monitoring circuit is further configured to define an offset value based on the first voltage measurement and the second voltage measurement, wherein the battery monitoring circuit is configured to determine the cell voltage associated with the particular battery cell based at least in part on the offset value.

Clause 12—The battery monitoring circuit of any of clauses 1-11, wherein the battery monitoring circuit is further configured to perform one or more battery management functions based on one or more additional cell voltage measurements and the offset value.

Clause 13— A method for monitoring a particular battery cell among a plurality of battery cells, wherein a supply wire from a supply circuit and a voltage measurement wire of a battery management circuit comprises a shared path for the particular battery cell, the method comprising: performing a first voltage measurement associated with the particular battery cell; performing a second voltage measurement associated with the particular battery cell and an additional element; and determining a cell voltage associated with the particular battery cell based on the first voltage measurement and the second voltage measurement.

Clause 14—The method of clause 13, wherein the additional element comprises an additional load and wherein performing the second voltage measurement includes controlling a switch introduce the additional load on the shared path.

Clause 15—The method of clause 13, wherein the additional element comprises a switchable current source, the method further comprising: increasing or decreasing current consumption in the shared path via the switchable current source for the second voltage measurement.

Clause 16—The method of any of clauses 13-15, wherein determining the cell voltage includes: calculating a resistance associated with the shared path based on the first voltage measurement and the second voltage measurement; calculating a voltage drop associated with the shared path; and determining the cell voltage based on a measured voltage drop associated with the particular battery cell minus the voltage drop associated with the shared path.

Clause 17—The method of clause 16, wherein:
the first voltage measurement is defined as:

$$VMEAS1 = VCell + (Rwire + Rfuse + Rconn)*Ivs, \text{ and}$$

the second voltage measurement is defined as:

$$VMEAS2 = VCell + (Rwire + Rfuse + Rconn)*(Ivs + Iload),$$
and wherein VMEAS1 is the first voltage measurement, VMEAS2 is the second voltage measurement, VCell measured voltage drop, Rwire+Rfuse+Rconn is a resistance associated with the shared path, Ivs is current through the particular cell, and Iload is current through the additional load, and wherein (Rwire+Rfuse+Rconn)=(VMEAS1−VMEAS2)/Iload.

Clause 18—The method of any of clauses 13-17, further comprising: selecting each of the plurality of battery cells at different times for different cell voltage measurements for the plurality of battery cells.

Clause 19—The method of any of clauses 13-18, further comprising: performing one or more battery management functions based on the determined cell voltage.

Clause 20—The method of any of clauses 13-19, further comprising: defining an offset value based on the first voltage measurement and the second voltage measurement; and determining the cell voltage associated with the particular battery cell based at least in part on the offset value.

Clause 21—The method of clause 20, further comprising, performing one or more battery management functions based on one or more additional cell voltage measurements and the offset value.

Clause 22— A BMS configured to monitor a plurality of battery cells arranged in series, the BMS comprising: a first battery management circuit configured to monitor a first subset of the plurality of battery cells; and a second battery management circuit configured to monitor a second subset of the plurality of battery cells, wherein the second subset is different than the first subset, wherein the first battery management circuit and the second battery management circuit each comprise: a battery monitoring circuit; and a supply interface circuit configured to supply power to the battery monitoring circuit, wherein the battery monitoring circuit is configured perform cell voltage measurements for a respective subset of the plurality of battery cells and wherein a supply wire from the supply interface circuit and a voltage measurement wire of the battery management circuit comprises a shared path for one or more of the respective subsets of the plurality of battery cells, wherein for a particular battery cell associated with the shared path, the respective battery monitoring circuit is configured to: perform a first voltage measurement associated with the particular battery cell; perform a second voltage measurement associated with the particular battery cell and an additional element; and determine a cell voltage associated with the particular battery cell based on the first voltage measurement and the second voltage measurement.

Clause 23—The BMS of clause 22, further comprising M battery monitoring circuits configured to monitor M subsets of the plurality of battery cells, wherein M is a positive integer greater than 2.

Various aspects and examples have been described in this disclosure. These and other aspects and examples are within the scope of the following claims.

The invention claimed is:

1. A battery monitoring circuit configured to monitor a plurality of battery cells, wherein the battery monitoring circuit is configured to be connected to a supply interface that supplies power to the battery monitoring circuit,
wherein the battery monitoring circuit is configured to perform cell voltage measurements for the plurality of battery cells and wherein a supply wire associated with the supply interface and a voltage measurement wire of the battery monitoring circuit comprises a shared path for one or more of the plurality of battery cells, wherein for a particular battery cell associated with the shared path, the battery monitoring circuit is configured to:
perform a first voltage measurement associated with the particular battery cell;
perform a second voltage measurement associated with the particular battery cell and an additional element; and
determine a cell voltage associated with the particular battery cell based on the first voltage measurement and the second voltage measurement.

2. The battery monitoring circuit of claim 1, wherein the additional element comprises an additional load, wherein to perform the second voltage measurement, the battery monitoring circuit is configured to control a switch to introduce the additional load on the shared path.

3. The battery monitoring circuit of claim 1, wherein the additional element comprises a switchable current source, wherein the battery monitoring circuit is configured to increase or decrease current consumption in the shared path via the switchable current source for the second voltage measurement.

4. The battery monitoring circuit of claim 1, wherein the battery monitoring circuit includes at least two different shared paths associated with at least two different battery cells.

5. The battery monitoring circuit of claim 1, wherein the battery monitoring circuit includes n wires and is configured to monitor n-1 battery cells where n is a positive integer greater than 2, wherein the battery monitoring circuit includes two shared paths associated with the supply interface and two particular battery cells, wherein for each of the particular battery cells, the battery monitoring circuit is configured to:
perform the first voltage measurement associated with the particular battery cell;
perform the second voltage measurement associated with the particular battery cell and the additional element; and
determine the cell voltage associated with the particular battery cell based on the first voltage measurement and the second voltage measurement.

6. The battery monitoring circuit of claim 1, wherein to determine the cell voltage, the battery monitoring circuit is configured to calculate a resistance associated with the shared path based on the first voltage measurement and the second voltage measurement, calculate a voltage drop associated with the shared path, and determine the cell voltage based on a measured voltage drop associated with the particular battery cell minus the voltage drop associated with the shared path.

7. The battery monitoring circuit of claim 6, wherein: the first voltage measurement is defined as:

$V\text{MEAS1} = V\text{Cell} + (R\text{wire} + R\text{fuse} + R\text{conn}) * I\text{vs}$, and the second voltage measurement is defined as:

$V\text{MEAS2} = V\text{Cell} + (R\text{wire} + R\text{fuse} + R\text{conn}) * (I\text{vs} + I\text{load})$, and wherein VMEAS1 is the first voltage measurement, VMEAS2 is the second voltage measurement, VCell is the measured voltage drop, (Rwire+Rfuse+Rconn) defines a resistance associated with the shared path, Ivs is current through the particular battery cell, and Iload is current through the additional load, and wherein: $(R\text{wire} + R\text{fuse} + R\text{conn}) = (V\text{MEAS1} - V\text{MEAS2})/I\text{load}$.

8. The battery monitoring circuit of claim 1, wherein for at least some of the plurality of battery cells that do not include the shared path, the battery monitoring circuit is configured to determine cell voltages based on measured voltage drops minus voltage drops over unshared pre-defined resistance paths.

9. The battery monitoring circuit of claim 8, further comprising:
a cell selection interface configured to select each of the plurality of battery cells at different times for the cell voltage measurements for the plurality of battery cells.

10. The battery monitoring circuit of claim 1, wherein the battery monitoring circuit is configured to perform one or more battery management functions based on the determined cell voltage.

11. The battery monitoring circuit of claim 1, wherein the battery monitoring circuit is further configured to define an offset value based on the first voltage measurement and the second voltage measurement, wherein the battery monitoring circuit is configured to determine the cell voltage associated with the particular battery cell based at least in part on the offset value.

12. The battery monitoring circuit of claim 11, wherein the battery monitoring circuit is further configured to perform one or more battery management functions based on one or more additional cell voltage measurements and the offset value.

13. A method for monitoring a particular battery cell among a plurality of battery cells, wherein a supply wire from a supply circuit and a voltage measurement wire of a battery management circuit comprises a shared path for the particular battery cell, the method comprising:
performing a first voltage measurement associated with the particular battery cell;
performing a second voltage measurement associated with the particular battery cell and an additional element; and
determining a cell voltage associated with the particular battery cell based on the first voltage measurement and the second voltage measurement.

14. The method of claim 13, wherein the additional element comprises an additional load and wherein performing the second voltage measurement includes controlling a switch to introduce the additional load on the shared path.

15. The method of claim 13, wherein the additional element comprises a switchable current source, the method further comprising:
increasing or decreasing current consumption in the shared path via the switchable current source for the second voltage measurement.

16. The method of claim 13, wherein determining the cell voltage includes:
calculating a resistance associated with the shared path based on the first voltage measurement and the second voltage measurement;
calculating a voltage drop associated with the shared path; and
determining the cell voltage based on a measured voltage drop associated with the particular battery cell minus the voltage drop associated with the shared path.

17. The method of claim 16, wherein: the first voltage measurement is defined as:

$V\text{MEAS1} = V\text{Cell} + (R\text{wire} + R\text{fuse} + R\text{conn}) * I\text{vs}$, and the second voltage measurement is defined as:

$V\text{MEAS2} = V\text{Cell} + (R\text{wire} + R\text{fuse} + R\text{conn}) * (I\text{vs} + I\text{load})$, and wherein VMEAS1 is the first voltage measurement, VMEAS2 is the second voltage measurement, VCell measured voltage drop, Rwire+Rfuse+Rconn is a resistance associated with the shared path, Ivs is current through the particular cell, and Iload is current through the additional load, and wherein $(R\text{wire} + R\text{fuse} + R\text{conn}) = (V\text{MEAS1} - V\text{MEAS2})/I\text{load}$.

18. The method of claim 17, further comprising:
selecting each of the plurality of battery cells at different times for different cell voltage measurements for the plurality of battery cells.

19. The method of claim 13, further comprising:
performing one or more battery management functions based on the determined cell voltage.

20. The method of claim 13, further comprising:
defining an offset value based on the first voltage measurement and second voltage measurement; and
determining the cell voltage associated with the particular battery cell based at least in part on the offset value.

21. The method of claim 20, further comprising, performing one or more battery management functions based on one or more additional cell voltage measurements and the offset value.

22. A battery management system (BMS) configured to monitor a plurality of battery cells arranged in series, the BMS comprising:
a first battery management circuit configured to monitor a first subset of the plurality of battery cells; and
a second battery management circuit configured to monitor a second subset of the plurality of battery cells, wherein the second subset is different than the first subset, wherein the first battery management circuit and the second battery management circuit each comprise:
a battery monitoring circuit; and
a supply interface circuit configured to supply power to the battery monitoring circuit,
wherein the battery monitoring circuit is configured to perform cell voltage measurements for a respective subset of the plurality of battery cells and wherein a supply wire from the supply interface circuit and a voltage measurement wire of the battery monitoring circuit comprises a shared path for one or more of the respective subsets of the plurality of battery cells, wherein for a particular battery cell associated with the shared path, the respective battery monitoring circuit is configured to:

perform a first voltage measurement associated with the particular battery cell;

perform a second voltage measurement associated with the particular battery cell and an additional element; and determine a cell voltage associated with the particular battery cell based on the first voltage measurement and the second voltage measurement.

23. The BMS of claim 22, further comprising N battery monitoring circuits configured to monitor N subsets of the plurality of battery cells, wherein N is a positive integer greater than 2.

\* \* \* \* \*